United States Patent [19]

Leger

[11] Patent Number: 5,436,561
[45] Date of Patent: Jul. 25, 1995

[54] RESONANCE MAGNETOMETER WITH OPTICAL PUMPING USING A MONOLITHIC LASER

[75] Inventor: Jean-Michel Leger, Meylan, France

[73] Assignee: Commissariat a l'Energie Atomique, Paris, France

[21] Appl. No.: 297,002

[22] Filed: Aug. 26, 1994

Related U.S. Application Data

[63] Continuation of Ser. No. 4,540, Jan. 14, 1993, abandoned.

Foreign Application Priority Data

Jan. 23, 1992 [FR] France .................. 92 00712

[51] Int. Cl.[6] .......................................... G01R 33/24
[52] U.S. Cl. ...................................... 324/301; 324/304
[58] Field of Search ............... 324/304, 301, 300, 322, 324/318; 128/653.2

[56] References Cited

U.S. PATENT DOCUMENTS

| | | | |
|---|---|---|---|
| 3,233,189 | 2/1966 | Guggenheim et al. | 372/41 |
| 3,503,006 | 3/1970 | Hoskins et al. | 372/41 |
| 3,719,901 | 3/1973 | Monchamp et al. | 372/41 |
| 4,525,672 | 6/1985 | Lam et al. | 324/301 |
| 4,617,462 | 10/1986 | Holt | 324/304 |
| 4,806,864 | 2/1989 | Schearer et al. | 324/301 |
| 4,860,304 | 8/1989 | Mooradian | 372/41 |
| 4,965,803 | 10/1990 | Esterowitz et al. | 372/41 |
| 5,086,432 | 2/1992 | Esterowitz | 372/41 |
| 5,117,437 | 5/1992 | Rand | 372/41 |
| 5,245,623 | 9/1993 | McFarlane | 372/41 |
| 5,295,146 | 3/1994 | Gavrilovic et al. | 372/41 |

FOREIGN PATENT DOCUMENTS

| | | |
|---|---|---|
| 0246146 | 11/1987 | European Pat. Off. . |
| 3150391 | 7/1983 | Germany . |
| WO9105273 | 4/1991 | WIPO . |

OTHER PUBLICATIONS

Journal Of Applied Physics, vol. 68, No. 3, Aug. 1, 1990, pp. 943–949, L. D. Schearer et al., "Tunable Lasers At 1080 NM For Helium Optical Pumping".

Journal Of Applied Physics, vol. 64, No. 12, Dec. 15, 1988, pp. 6615–6617, R. E. Slocum et al., "ND:LNA Laser Optical Pumping Of 4HE: Application To Space Magnetometers".

Primary Examiner—Sandra L. O'Shea
Assistant Examiner—Raymond Y. Mah
Attorney, Agent, or Firm—Oblon, Spivak, McClelland, Maier & Neustadt

[57] ABSTRACT

Resonance magnetometer with optical pumping using a monolithic laser. The laser (30) includes a single element (32) (crystal or fiber) ensuring whose length is modulated to provide both a wavelength and amplitude control.

8 Claims, 2 Drawing Sheets

RESONANCE MAGNETOMETER WITH OPTICAL PUMPING USING A MONOLITHIC LASER

This application is a Continuation of application Ser. No. 08/004,540, filed on Jan. 14, 1993, now abandoned.

FIELD OF THE INVENTION

The present invention concerns a magnetometer with resonance and optical pumping using a monolithic laser. It is able to be applied for measuring weak magnetic fields (typically within a range of between 20 and 70 $\mu T$ corresponding to the values of the terrestrial magnetic field).

BACKGROUND OF THE INVENTION

The magnetometer of the invention falls within the category of resonance magnetometers described in the article by F. HARTMAN and entitled "Resonance Magnetometers" published in the journal "IEEE Transactions on Magnetics", vol. MAG-8, No 1, March 1972, pp. 66–75.

A resonance magnetometer is a device which, when plunged into a magnetic field Bo, delivers an electric signal with a frequency F and whose value is linked to Bo by the LARMOR equation:

$$F = \gamma\, Bo$$

where $\gamma$ is a gyromagnetic ratio (of an electron or nucleon depending on the substance used). For an electron, this ratio is equal to 28Hz/nT, for example.

In this category of devices, the magnetometer with optical pumping occupies an overriding place. The general constitution of this magnetometer is diagrammatically shown on FIG. 1.

A cell 10, at least partly transparent, is filled with a gas 12, generally helium (isotope 4) at a pressure of between 1 and several torrs. A luminous source 14 delivers a luminous beam 15 whose wavelength is situated around 1.1 $\mu m$ if helium is used. This beam is injected into the cell 10.

Furthermore, a weak or mild radiofrequency discharge is produced in the gas by suitable means (not shown). This discharge produces atoms in a metastable state ($2^3 S_1$ in the case of helium). The incident luminous beam 15 "pumps" these atoms from the metastable state so as to bring them into another excited state ($2^3 P$).

In the presence of a magnetic field Bo, the energy levels are separated into sub-levels known as ZEEMAN sub-levels. A radiofrequency resonance between these sub-levels may be established by a radiofrequency field (magnetic resonance) or by modulation of the light (optical double resonance). In the case of helium and for the isotope 4, resonance is established between two ZEEMAN electronic sub-levels of the metastable state. This resonance is revealed by various known types of electronic means and shown on the diagrams on FIG. 1 by a photodetector 16, processing means 18 and a device 20 to measure the frequency of the processed electric signal. The present invention does not concern these means and shall not be described in detail as any suitable device shall suffice. For example, reference may be made to the set of four patents lodged by the current Applicant, namely FR-A-2 663 429, FR-A-2 663 430, FR-A-2 663 431 and FR-A-2 663 434 which describe various dispositions able to be used to measure the frequency F.

Once the frequency F has been measured, the value Bo of the ambient magnetic field is instantly deduced by the ratio $Bo = F/\gamma$.

The luminous source used in this type of application needs to have special characteristics.

Firstly, it needs to emit at a wavelength tuneable around the $2^3 S_1 - 2^3 P$ of the helium. This wavelength then needs to be stabilized on one of the lines of this transition, for example the line Do in the case of the isotope 4 of the helium.

Furthermore, this implies that the laser, used to constitute this source only emitting this single wavelength as wavelength modes differing from that of the selected transition, would result in degrading the performances of the magnetometer: increasing the amplitude noise of the laser, appearance of modal noise, possible resonance frequency shifts of the magnetometer linked to movements of the energy levels of the helium atoms under the effect of the non-optical interaction, reduction of the efficiency of optical pumping, etc.

The entire energy emitted thus needs to be within the wavelength range corresponding to the selected transition which, for example, corresponds to a frequency band of about 2 GHz at ambient temperature for the line Do of the helium.

Finally, the source needs to be insensitive to its thermic and mechanical environment.

For all these reasons, traditional helium lamps have been replaced by optically pumped solid lasers. Thus, the document FR-A-2 598 518 (or its European counterpart EP-A-0246 146) concerns a magnetometer where the laser is an LNA laser (lanthane-neodyme aluminate laser). Reference may also be made to the article by L. D. SCHEARER et al and entitled "Tunable Lasers at 1080 nm for Helium Optical Pumping" published in J. Appl. Phys. 68 (3) on 1 Aug. 1990, pp. 943–949 or even the article by L. D. SCHEARER et al entitled "LNA: A New Cw Nd Laser Tunable Around 1.05 and 1.08 $\mu m$" published in IEEE J. of Quant. Electronics, vol. QE-22, No 5, May 1986, pp. 713–717.

In these prior techniques, the solid laser used is associated with a large number of devices, as shown diagrammatically on FIG. 1. In the example represented, the solid laser, which is optically pumped by a source LD associated with a focusing and formation optic system L1, L2, includes:

a crystal A constituting the amplifier environment; this crystal may consist of LNA and be about 5 mm long with a diameter of 5 mm: multidielectric layers (reflection coefficient exceeding 99% at 1.08 $\mu m$ and transmission coefficient of more than 95% for the pumping light) are deposited on the front face of this crystal so that the latter also constitutes an inlet mirror M1 of the laser cavity;

an outlet mirror M2; a dichroic treatment of this mirror is able to force the emission of the laser onto the band centered around 1.03 $\mu m$; the LNA fluorescence spectrum in fact has two bands around 1 $\mu m$, the most intense being situated close to 1.054 $\mu m$; the retained multidielectric treatment (transmission of 50% for $\lambda = 1.05\ \mu m$ and transmission of about 1.5% for $\lambda = 1.08\ \mu m$) makes it possible to prevent the laser from oscillating spontaneously close to the wavelength of the main fluorescence band; it is also possible to use a LYOT filter given the reference LY on FIG. 1;

one or several solid FABRY-PEROT type standards with a thickness of several hundreds of microns (150 $\mu m$ and 200 $\mu m$, for example) inserted in the cavity; these FABRY-PEROT standards play the role of selective wavelength elements; control of their thickness and/or their inclination (that is, control of the optical length to which they correspond) makes it possible to wavelength-tune the laser;

finally, so as to finely tune this emitted wavelength, a piezoelectric shim P2 equips the mount of the outlet mirror M2 of the cavity; it is then possible to slightly make the length of this cavity vary and have the wavelength of the laser coincide with the center of the absorbtion line retained (for example, the line Do) ; it is generally by this means that wavelength control of the laser is effected from a flourescence measurement of a helium cell.

In other embodiments, described in the article by L. D. SCHEARER et al already referred to, the crystal constituting the amplifier environment may be replaced by an optical fiber doped with neodyme. The general structure of the device remains identical to that described above for the LNA laser.

The major drawback of these magnetometers lies in the difficulties encountered in stabilizing the emission wavelength of the laser. This wavelength is in fact determined by a set of elements, namely:

the total length of the cavity (which fixes the place of the modes of the cavity), the length of the amplifier environment (crystal or doped fiber) which often constitutes a FABRY-PEROT resonator giving rise to a parasite standard effect, the thickness and inclination of the selective elements (E1, LY).

So as to obtain the laser effect concerning the desired transition, it is advisable that all these parameters be simultaneously adjusted, the variation of any one of them being immediately expressed by a variation of the wavelength emitted by the laser and a deterioration of the performances of the magnetometer.

Owing to this, the magnetometers using such lasers are extremely sensitive to the environment, especially to mechanical vibrations or thermic variations. In fact, a temperature variation is expressed by a dilatation or shrinkage of the materials, which accordingly shifts the wavelength. Thus, for example, for the LNA crystal, a temperature variation $\Delta T$ is expressed by an index variation of about $2.1 - 10^{-5} \Delta T$.

The same applies for the FABRY-PEROT blade, these two parameters further modifying the total length of the cavity. In practice, this is finally expressed by the need to control the temperature of the various elements of the cavity with a precision of about several hundredths of a degree.

Similarly, it is essential to automatically control the total length of the cavity by moving the outlet mirror.

Finally, it may be observed that these lasers are expensive, that is exceeding 100 kF (about $30,000.00) in the current state of the art.

SUMMARY OF THE INVENTION

The invention is able to resolve these drawbacks. To this end, the invention suggests using a monolithic structure to constitute the laser, that is a single solid element fulfilling both functions regarding amplification and wavelength selection.

In one first variant, the sole solid element is an amplifier crystal whose two faces are covered with reflecting layers and whose thickness is such that the laser oscillates on a single longitudinal mode with a wavelength able to optically pump the gas of the cell.

In this case, the fluorescence band of the crystal needs to contain the wavelength of the transition retained for optical pumping of the gas (for example, $\lambda_o = 10829.081$ Å corresponding to the line Do of the helium). The optical pumping light is focused on the crystal whose thickness is such that the laser, via its construction, is a longitudinal monomode. This thickness varies according to the extent of the wavelength around which the crystal is able to function. The larger this extent is, the more the crystal needs to be fine. The mirrors of the cavity are directly laid on this crystal whose length solely determines the emitted wavelength. For example, when using an LNA crystal, the inlet face serves as a support for a treatment of multidielectric layers so as to produce a reflection coefficient of more than 99% at 1.08 $\mu$m and a transmission coefficient of more than 95% for the optical pumping wavelength; the treatment of the outlet face is such that the transmission coefficient exceeds 50% for 1.05 $\mu$m and about several percents for 1.08 $\mu$m.

In a second embodiment, the sole solid element is an amplifying optical fiber etched on at least one portion of its length by a diffraction grating with one pitch and a wavelength so that the laser oscillates on a wavelength able to optically pump the gas of the cell.

The grating may be etched on the fiber according to the technique described in the article by M. DOUAY and al and entitled "Formation of Bragg Gratings in Germanium Doped Optical Fibers Using a Prism Interferometer" publised in the Journal de Physique, 4, (1991).

Whereas in the first embodiment, the sole parameter to be controlled to ensure that the laser emitting on the desired length was the length of the crystal, in this second embodiment, it is essential to control the pitch of the grating so as to control the wavelength emitted by the laser, the length of the grating determining the width of the modes emitted.

Irrespective of the embodiment implemented, the recourse to a sole solid element makes it possible to resolve all the drawbacks of the prior art mentioned earlier.

So as to avoid these drawbacks, there is another solution which could be used and consisting of using a semiconductor laser as described in the document U.S. Pat. No. 5,036,278 and not a solid laser pumped by an annexed source. But the recourse to this type of semiconductive laser does have other drawbacks, such as the weakness of the luminous intensity emitted and the fluctuation of the wavelength according to the feed current.

DETAILED DESCRIPTION OF THE PREFERRED EMBODIMENTS

Figure 1:
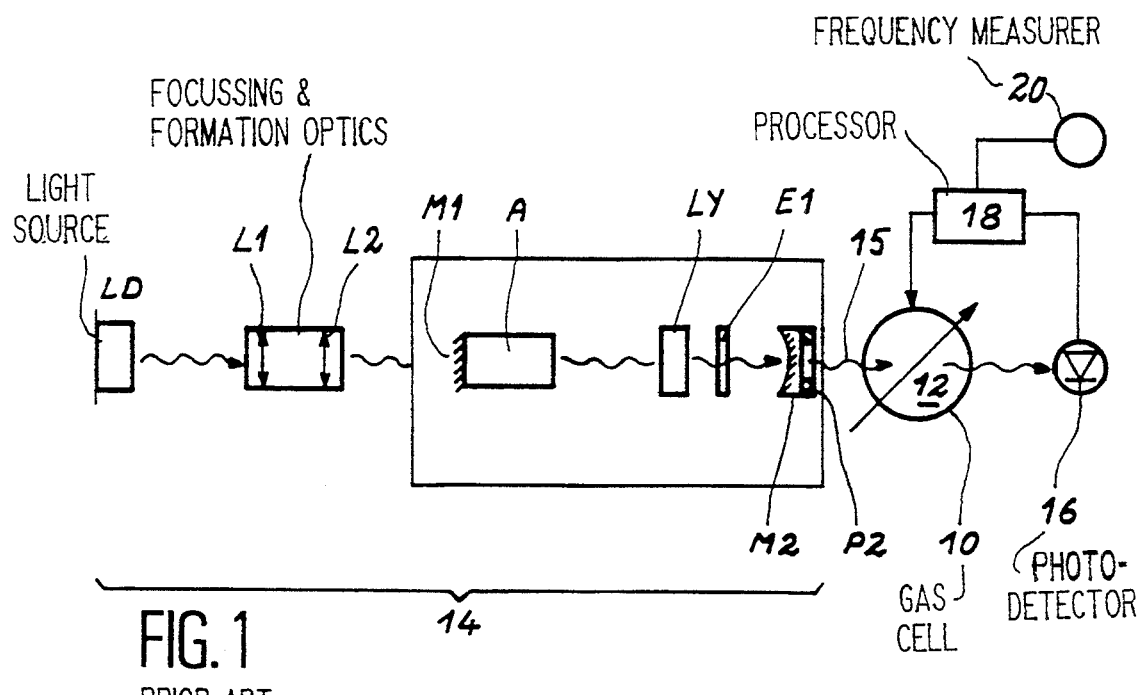
FIG. 1, already described, shows a magnetometer according to the prior art.
Figure 2:
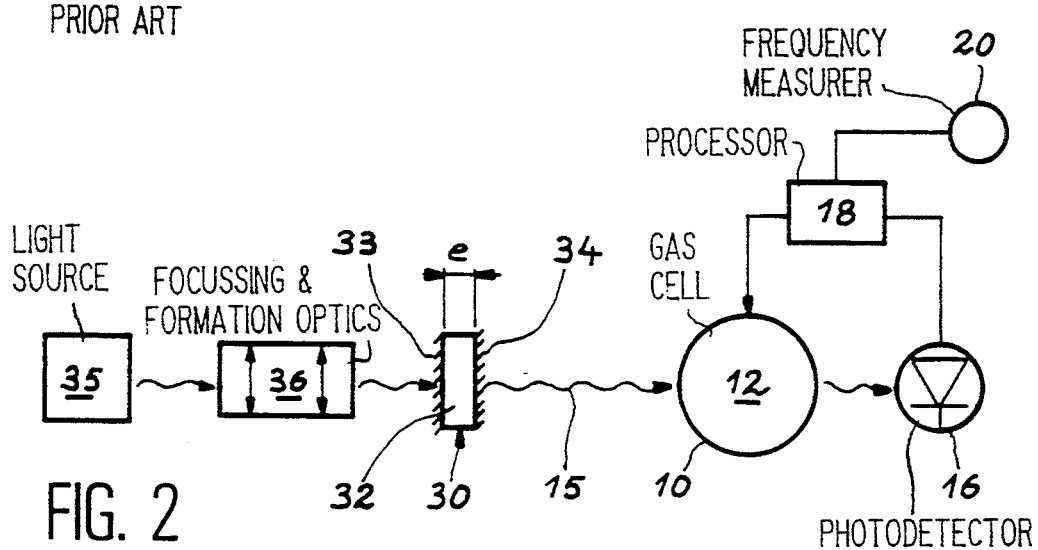
FIG. 2 shows one first embodiment of the invention.

FIG. 2 shows a magnetometer according to the invention with means 10, 12, 15, 16, 18 and 20 able to determine the LARMOR frequency, said means already listed with reference to FIG. 1. In accordance with the invention, the magnetometer includes a monolithic unit 30 including a crystal 32 with a thickness e with two faces 33 and 34 suitably treated so as to have the required transmission and reflection coefficients, as explained earlier. The unit 30 is excited by a pumping source 35 whose beam is possibly shaped by a unit 36 (in particular including focusing lenses and possibly an anamorphosis device).

Figure 3:
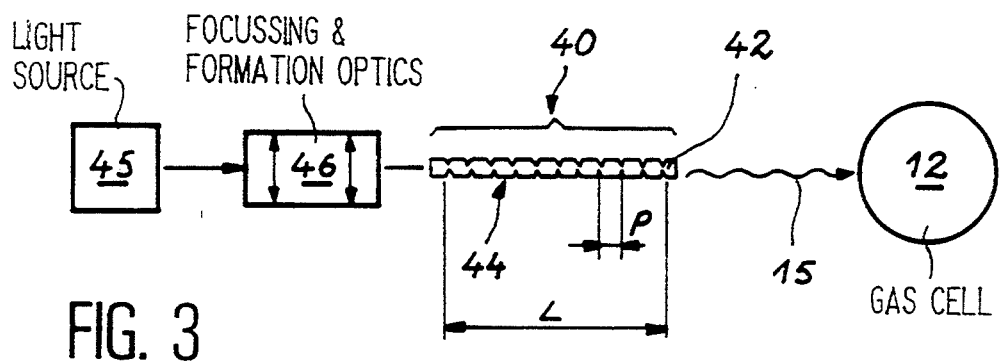
FIG. 3 shows a second embodiment of the invention.

FIG. 3 shows a magnetometer according to a second embodiment in which the monolithic unit 40, is constituted by an optical fiber 42 with at least one portion of its surface being etched by a grating 44 with a pitch p and a length L. The fiber is further pumped by a pumping source 45 associated with a focusing and shaping device 46.

Regardless of the embodiment selected, it may be useful to control the wavelength emitted by the laser at a reference control value corresponding to the absorption peak of the gas used. In order to do this and according to a known technique relating to frequency-stabilized lasers, the emitted wavelength is low-frequency modulated, the effects of this modulation are detected, for example, on fluoresecence of the gas, and the emitted wavelength is corrected so as to return to the reference control value.

Figure 4:
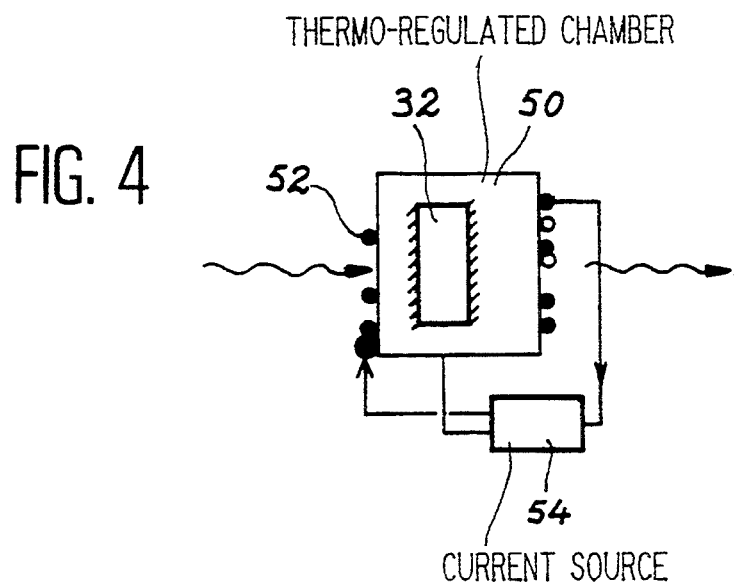
FIG. 4 shows a device for the thermic modulation of the wavelength.
Figure 5:
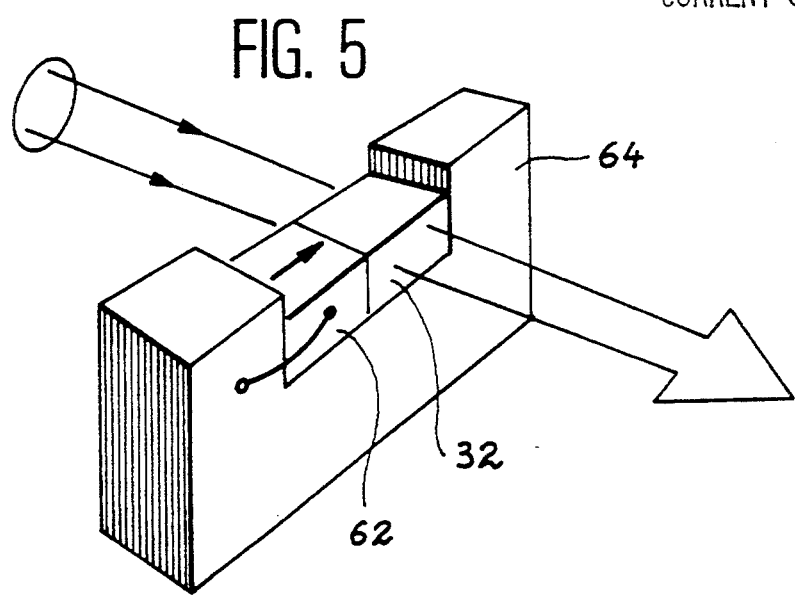
FIG. 5 shows a device for the piezoelectric modulation of the wavelength in the case of the first embodiment.
Figure 6:
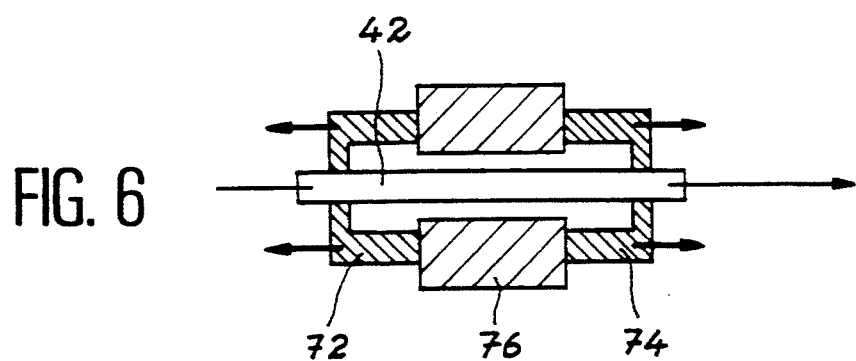
FIG. 6 shows a device for the piezoelectric modulation of the wavelength in the case of the second embodiment.

So as to modulate the wavelength, three devices may be used and are shown on FIGS. 4, 5 and 6.

First of all, FIG. 4 shows these means consisting of a thermoregulated chamber 50 provided with a heating coil 52 fed by a current source 54. In this variant, the modification of the wavelength results in a thickness variation of the crystal 32.

FIG. 5 shows a different piezoelectric type mounting where the crystal 32 is sandwiched between a piezoelectric bar 62 and a stop 64 according to a disposition described in the article by J. J. ZAYHOWSKI and al and entitled "Frequency-modulated Nd:YAG microchip lasers" published in Optics Letters, vol. 14, No. 12, 15 Jun. 1989, pp. 618-620.

Finally, FIG. 6 relating to the fiber variant shows two piezoelectric bars 72 and 74 with a shim 76, the entire unit enabling the fiber 42 to be extended or release it and thus modify its functioning wavelength by modifying the pitch of the grating.

What is claimed is:

1. A magnetometer, comprising:
    a light source for pumping a laser amplifier;
    a gas cell that is filled with gaseous atoms that exhibit a gyromagnetic ratio;
    a solid laser amplifier that is optically pumped by the light source, the solid laser amplifier comprising a laser crystal made of a single solid element and two end mirrors, the end mirrors being in contact with the laser crystal so that a laser cavity is defined by the solid laser amplifier, the laser cavity being structure so that said solid laser amplifier produces an output having a bandwidth and a wavelength at which the output bandwidth is centered, such that the output is suitable for optically pumping the gaseous atoms of the gas cell for generating oscillations in the gas cell at a LARMOR frequency of the gaseous atoms;
    means for processing an electric resonance signal at a LARMOR frequency $F = \gamma Bo$ of the gaseous atoms of the gas cell, where Bo is an ambient magnetic field in the gas cell; and
    means for determining the amplitude of the ambient magnetic field from the frequency F.

2. A magnetometer according to claim 1, wherein the geometry of the laser amplifier is such that the laser amplifier operates in a single longitudinal mode of the laser cavity.

3. A magnetometer according to claim 2, further comprising:
    wavelength selection means for selecting the wavelength that is emitted by the laser amplifier, wherein the wavelength selection means comprises means for low-frequency modulating the wavelength that is produced by the laser amplifier and means to control the wavelength at a reference value.

4. A magnetometer according to claim 3, wherein the means for low-frequency modulating comprises means for modulating the temperature of the laser crystal.

5. A magnetometer according to claim 3, wherein the means for low-frequency modulating comprises means for applying mechanical compression to the laser crystal.

6. A magnetometer according to claim 1, wherein the wavelength selection means comprises means for controlling the temperature of the laser crystal.

7. A magnetometer according to claim 1, wherein said gaseous atoms consist essentially of He atoms.

8. A magnetometer according to claim 1, wherein said bandwidth is about 2 gigahertz.

* * * * *